United States Patent [19]
Schadler

[11] Patent Number: 4,988,961
[45] Date of Patent: Jan. 29, 1991

[54] DEVICE FOR ACHIEVING MINIMAL REFLECTIONS IN ANTENNA COUPLING

[75] Inventor: John L. Schadler, Lindenwold, N.J.

[73] Assignee: General Signal Corporation, Stamford, Conn.

[21] Appl. No.: 392,223

[22] Filed: Aug. 10, 1989

[51] Int. Cl.[5] ...................... H03H 5/000; H01Q 1/050
[52] U.S. Cl. ...................................... 333/26; 333/125; 333/127; 343/862
[58] Field of Search ..................... 333/254, 260, 21 R, 333/26, 125, 127; 343/850, 860, 863, 862

[56] References Cited

U.S. PATENT DOCUMENTS 2,658,145 11/1953 Dorne et al. ........................ 343/863
3,023,381 2/1962 Rowland ............................. 333/254
3,086,181 4/1963 Lind .................................. 333/254
3,239,713 3/1966 Evans et al. .......................... 333/26
3,528,041 9/1970 Honda et al. ..................... 333/21 R

FOREIGN PATENT DOCUMENTS 0247302 12/1985 Japan .................................... 333/26

*Primary Examiner*—Rolf Hille
*Assistant Examiner*—Peter T. Brown
*Attorney, Agent, or Firm*—Robert R. Hubbard; John F. Ohlandt

[57] ABSTRACT

A technique and arrangement for lowering the mismatch normally obtained, thereby increasing the bandwidth, in a standard rectangular-to-coaxial waveguide "T" junction coupling in an antenna system.

8 Claims, 3 Drawing Sheets

FIG. 1

DEVICE FOR ACHIEVING MINIMAL REFLECTIONS IN ANTENNA COUPLING

BACKGROUND OF THE INVENTION

The present invention relates to antenna systems, and more particularly to a system in which a so-called center-feed television antenna is involved, and it is desired to couple a more or less standard or conventional rectangular waveguide to a coaxial transmission line.

In effectuating a coupling of a coaxial transmission line to a waveguide transmission line, the arrangement usually adopted is a so-called "T" transition of the standard rectangular waveguide to the coaxial line. In such a configuration, the inner conductor of the coaxial transmission line passes directly through the center of the rectangular waveguide with the coaxial "outers" shorted to both the top and bottom of the rectangular waveguide.

It will be understood by those skilled in the art that if a transmission line is terminated in an impedance different from its own characteristic impedance, reflection will occur and there will be standing waves of voltage and current along the line, which may be large if there is a considerable mismatch. This is the case in the rectangular-to-coaxial waveguide "T" junction since the characteristic impedance of the coaxial line is usually different from that of the rectangular waveguide.

It will further be understood by those skilled in the art that, in general, standing waves caused by mismatches are undesirable because they prevent maximum transfer of power. The solution to this difficulty is to obtain a match between the transmission lines, and for this purpose it is possible to use a properly located matching network.

However, as will also be appreciated, matching techniques are usually performed at a particular frequency. Thus, when the system is matched to that desired frequency, no reflections will occur at the frequency. However, how the system behaves at frequencies other than the desired design or matching frequency is also of significant concern. In many antenna applications, a device must have minimal reflections over a wide range of frequencies. A device with this important characteristic is sometimes referred to as "broad-band".

Accordingly, it is a primary object of the present invention to enable suitable coupling of different types of lines within an antenna structure or system and to insure that such device for coupling or matching purposes possesses a "broad-band" characteristic.

For purposes of the present discussion, the bandwidth may be defined as follows: Let fu and fl be the upper and lower frequencies of operation for which satisfactory performance is obtained. Let fc be the design frequency for which the device is matched. The bandwidth can then be represented by a percentage or $$\frac{fu - fl}{fc} \times 100.$$

For the earlier-noted television broadcast application, the coupling of a coaxial transmission line to a waveguide transmission line in the form of a so-called "T" junction had to have a bandwidth of $$\frac{812\text{ MHz} - 794\text{ MHz}}{803\text{ MHz}} \times 100\ 2.25\%$$

within a 1.1:1 VSWR (voltage standing wave ratio) circle. It should be especially noted that the 1.1:1 VSWR specification denotes the reflection characteristics of the device. Accordingly, the measured impedance should fall within the VSWR circle for the device to be considered to have appropriate or proper reflection characteristics.

It has sometimes been the practice in coupling a coaxial transmission line to a waveguide transmission line to provide a circular cylinder coupling or connecting device, such device having a larger diameter than the coaxial transmission line. This connecting device is referred to as a slug. However, such circular cylinder connection device or slug has not proven satisfactory in the waveguide-to-coaxial line junction context.

It is therefore another fundamental object of the present invention to achieve for an antenna coupling minimal reflections over a wide range of frequencies. More specifically, it becomes an object to realize the bandwidth noted above within a 1.1:1 VSWR circle.

SUMMARY OF THE INVENTION

The above and other objects are realized by the improvement in accordance with the present invention whereby the coupling involves a slug or connection member which includes back-to-back conical sections such that the rims or large diameter ends of the sections confront each other. Such a configuration is referred to as a diconical slug and the slug has longitudinal, lateral, and transverse axes. Further provided are means for mounting the slug to the waveguide transmission line along the transverse axis of the slug, the coaxial transmission line being coupled or connected to the slug along its longitudinal axis and the waveguide transmission line extending along said lateral axis. More specifically, the improved device has impedance values, in the operating range of approximately 794 megahertz to 812 megahertz, within the 1.1:1 circle of voltage standing wave ratios.

In contrast to the device and improved arrangement according to the present invention, experiments were performed in which the input mismatch to a "T" junction were approximately 4:1. The impedance of the "T" junction was measured over an 18 megahertz frequency range from 794 to 812 megahertz. The impedance, as measured using a common rectangular waveguide matching technique involving "iris post" tuning, was plotted on a standard Smith chart; the resulting bandwidth that occurred within the 1.1:1 VSWR circle was 1.56%.

When the resulting impedance was plotted, it was obvious that the conventional "T" junction did not meet the original specification requirement and hence a device with a broader band had to be realized. The complete realization of such device by the present invention will be made clear hereinafter.

Other and further objects, advantages and features of the present invention will be understood by reference to the following specification in conjunction with the annexed drawing, wherein like parts have been given like numbers.

DESCRIPTION OF PREFERRED EMBODIMENT

Figure 1:
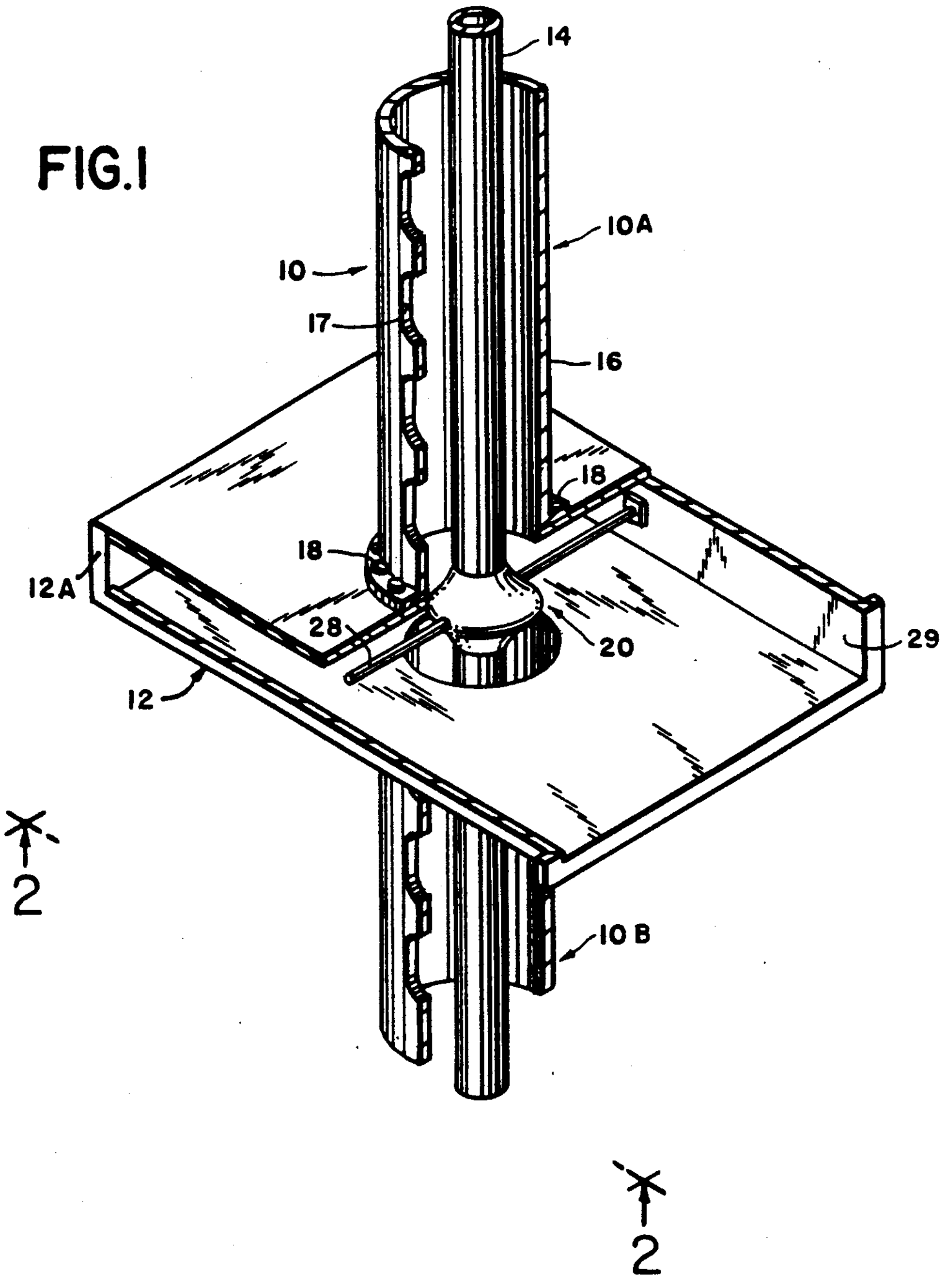
FIG. 1 is a perspective view, broken away and partly in section, showing a "T" junction, involving the coupling of a rectangular waveguide to a coaxial line, and particularly illustrating the technique and device of the present invention.
Figure 2:
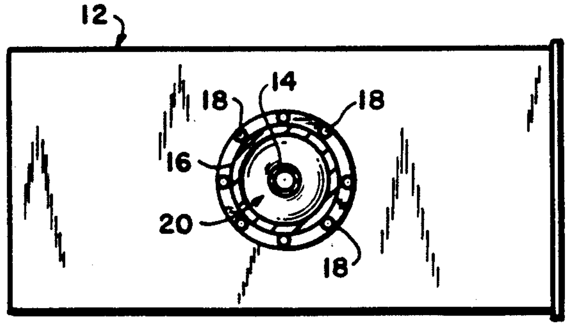
FIG. 2 is a bottom plan view of the coupling scheme of the present invention.

Referring now to the figures of the drawing, in FIG. 1 there will be seen an antenna coupling arrangement in the specific form of a so-called "T" junction. Thus, there appears a coaxial transmission line 10 having an upper portion 10A and a lower portion 10B. Coupled to this line is a rectangular waveguide 12 having a waveguide short 12A at its one end.

The coaxial line 10 comprises an inner conductor 14 and, coaxially surrounding it, an outer conductor 16 having slots 17. Such a slotted outer conductor is conventional, as will be seen from U.S. Pat. No. 4,129,871 to Mckinley R. Johns. In conventional fashion, the upper and lower portions of the outer conductor 16 are secured to the waveguide 12 such as by bolts 18.

Figure 5:
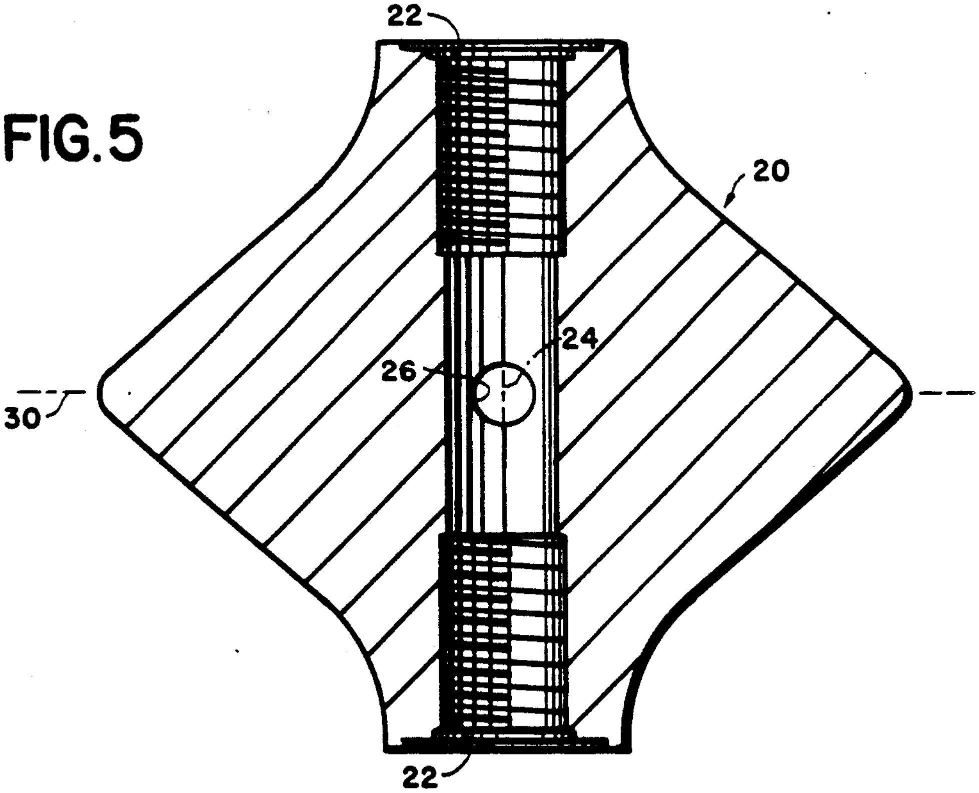
FIG. 5 is a sectional view, taken on the line 5—5 of FIG. 4, of the diconical slug of the present invention.
Figure 4:
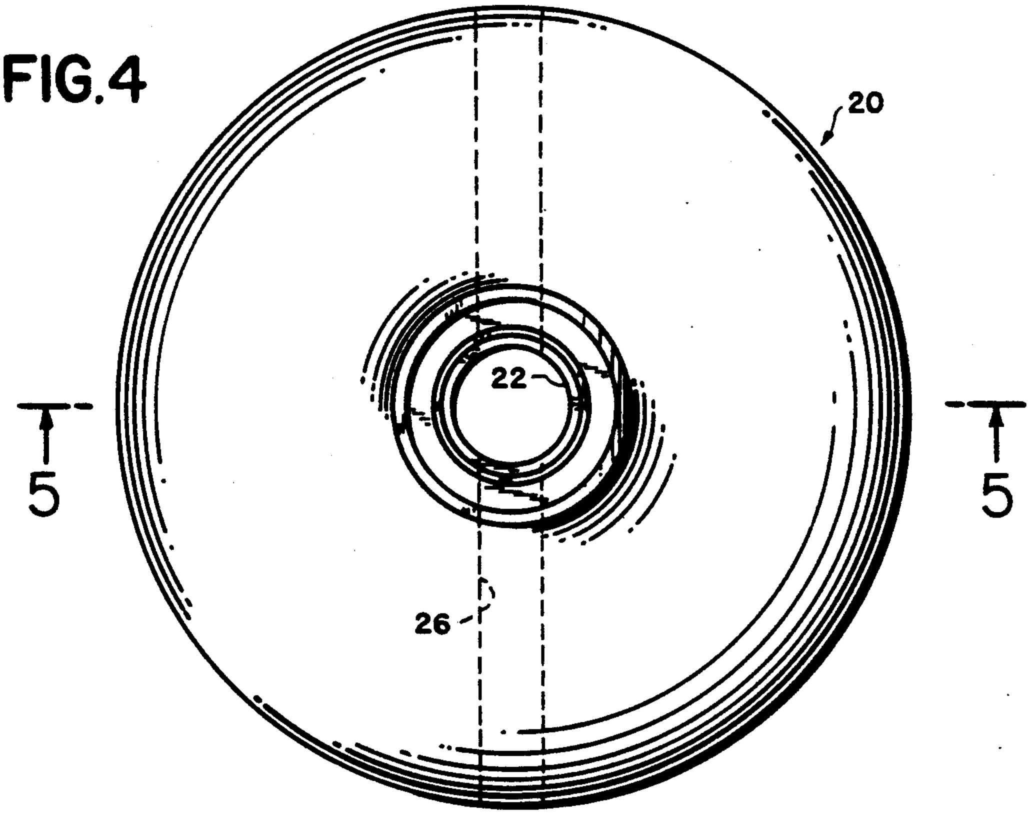
FIG. 4 is an end view of the diconical slug of the present invention.

A specially designed slug 20 has a diconical configuration, i.e., it includes back-to-back conical sections such that the wide diameter portions of sections confront each other. As will be seen in FIGS. 4 and 5, the slug 20 is of solid construction, being made of free-cutting brass with a bright silver plate finish, but having threaded portions 22 at its ends along its longitudinal axis 24.

A bore 26 is provided along the slug's transverse axis such that a pipe 28 may be fitted therethrough for mounting purposes, the pipe being welded or otherwise secured to the opposite faces 29 of the waveguide 12. The lateral axis 30 of the slug 20 corresponds with the axis of the waveguide.

Figure 3:
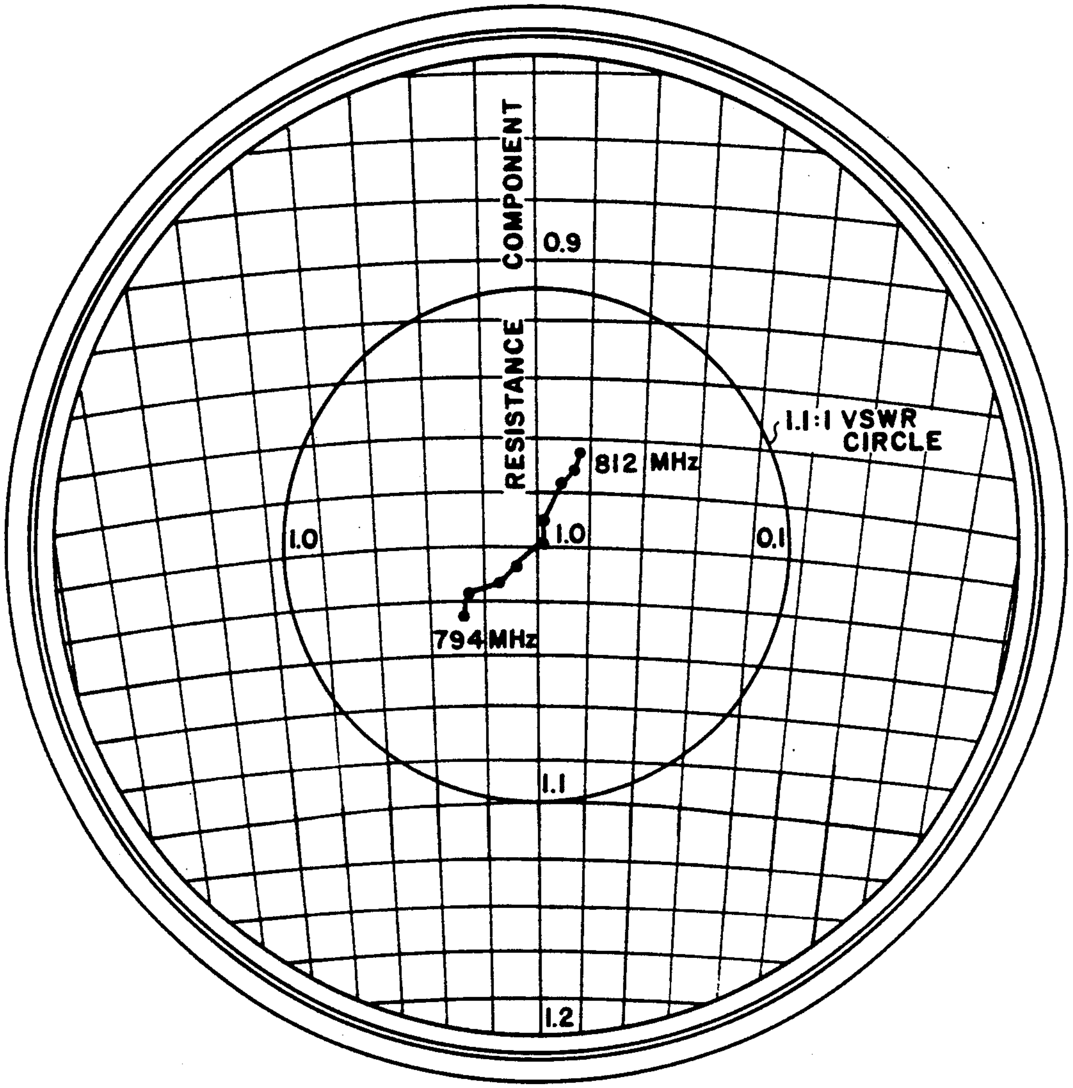
FIG. 3 is a plot of the impedance measurements made on the system previously depicted in FIGS. 1 and 2, and particularly showing the confinement of the impedance curve within the VSWR circle shown in this figure.

Referring now to FIG. 3 of the drawing, there will be seen an impedance measurement of the entire system of FIG. 1. The matching is obtained by iris post tuning, a technique well known in the art. It will be particularly noted that in accordance with the desired objective, the impedance curve falls within the 1.1:1 VSWR circle and, for this reason, the arrangement according to the present invention meets the demanding requirement that there be a broadband characteristic for the antenna coupling as described.

While there has been shown and described what is considered at present to be the preferred embodiment of the present invention, it will be appreciated by those skilled in the art that modifications of such embodiment may be made. It is therefore desired that the invention not be limited to this embodiment, and it is intended to cover in the appended claims all such modifications as fall within the true spirit and scope of the invention.

I claim:

1. In a T-junction of a coaxial transmission line to a waveguide transmission line, in which measured impedance values, over a range of approximately 30 MHz in a UHF band are to be held within a 1.1:1 circle of voltage standing wave ratio, the improvement which achieves minimal reflection over said range of frequencies comprising: a diconical slug, connected between an upper and lower portion of the coaxial transmission line and mounted for support within the structure of the waveguide transmission line, said diconical slug including back-to-back conical sections, such that large diameter ends of the conical sections confront each other.

2. A device as defined in claim 1, in which said diconical slug has longitudinal, lateral, and transverse axes; means for mounting said diconical slug to said waveguide transmission line along said transverse axis, said coaxial transmission line being coupled to said diconical slug along said longitudinal axis and said waveguide transmission line extending along said lateral axis.

3. A device as defined in claim 2, in which threaded fittings are provided on said diconical slug for receiving individual portions of said coaxial transmission line at opposite longitudinal ends of said diconical slug.

4. A device as defined in claim 1, said device having measured impedance values, in the range of approximately 794 MHz to 812 MHz, within the 1.1:1 circle of voltage standing wave ratios.

5. An antenna coupling system for achieving minimal reflection over approximately a 30 MHz range of frequencies in a UHF band comprising: a T-junction between a waveguide and a coaxial transmission line, and a diconical slug disposed at the junction between upper and lower faces of the waveguide and coupled to said coaxial transmission line, said diconical slug including back-to-back conical sections, such that large diameter ends of the conical sections confront each other.

6. A device as defined in claim 5, in which said diconical slug has longitudinal, lateral, and transverse axes; means for mounting said slug to said waveguide along said transverse axis, said coaxial transmission line being coupled to said diconical slug along said longitudinal axis and said waveguide extending along said lateral axis.

7. A device as defined in claim 6, in which threaded fittings are provided on said diconical slug for receiving individual portions of said coaxial transmission line at opposite longitudinal ends of said diconical slug.

8. A device as defined in claim 5, said device having impedance values, in the range of approximately 794 MHz to 812 MHz, within the 1.1:1 circle of voltage standing wave ratios.

* * * * *